(12) United States Patent
Watanabe et al.

(10) Patent No.: US 7,880,574 B2
(45) Date of Patent: Feb. 1, 2011

(54) SUPERCONDUCTING MAGNET AND MAGNETIC RESONANCE IMAGING APPARATUS USING THE SAME

(75) Inventors: Hiroyuki Watanabe, Ibaraki (JP); Jun Kawamura, Ibaraki (JP); Tomoo Chiba, Ibaraki (JP); Miki Yamazaki, Chiba (JP); Teruhiro Takizawa, Ibaraki (JP)

(73) Assignees: Hitachi, Ltd., Tokyo (JP); Hitachi Engineering & Services Co., Ltd., Ibaraki-ken (JP)

( * ) Notice: Subject to any disclaimer, the term of this patent is extended or adjusted under 35 U.S.C. 154(b) by 0 days.

(21) Appl. No.: 11/617,765

(22) Filed: Dec. 29, 2006

(65) Prior Publication Data

US 2007/0152789 A1 Jul. 5, 2007

(30) Foreign Application Priority Data

Jan. 5, 2006 (JP) .............................. 2006-000834
Jul. 11, 2006 (JP) .............................. 2006-190146

(51) Int. Cl.
*H01F 7/00* (2006.01)
*H01F 1/00* (2006.01)
*H01F 6/00* (2006.01)
*H01F 5/00* (2006.01)
*G01V 3/00* (2006.01)

(52) U.S. Cl. .................... 335/216; 335/299; 324/318
(58) Field of Classification Search ................ 335/216, 335/296–299; 324/318
See application file for complete search history.

(56) References Cited

U.S. PATENT DOCUMENTS

| | | | |
|---|---|---|---|
| 4,587,490 A * | 5/1986 | Muller et al. ............... 324/320 |
| 5,168,211 A * | 12/1992 | Laukien et al. ............. 324/319 |
| 5,239,276 A * | 8/1993 | Roth et al. .................. 335/216 |
| 5,291,169 A * | 3/1994 | Ige et al. ..................... 335/216 |
| 5,381,122 A * | 1/1995 | Laskaris et al. ............. 335/216 |
| 5,389,909 A * | 2/1995 | Havens ........................ 335/216 |
| 5,402,094 A * | 3/1995 | Enge ............................ 335/296 |
| 5,485,088 A * | 1/1996 | Westphal et al. ............ 324/320 |
| 5,528,210 A * | 6/1996 | Huang et al. ................ 335/216 |
| 5,545,997 A * | 8/1996 | Westphal et al. ............ 324/320 |

(Continued)

FOREIGN PATENT DOCUMENTS

| | | | |
|---|---|---|---|
| EP | 0694931 | | 1/1996 |
| JP | 05121227 A | * | 5/1993 |
| JP | 2002-65635 | | 3/2002 |

*Primary Examiner*—Anh T Mai
*Assistant Examiner*—Alexander Talpalatskiy
(74) *Attorney, Agent, or Firm*—Mattingly & Malur, P.C.

(57) ABSTRACT

A superconducting magnet includes: first and second torus coolant containers substantially symmetrically, vertically arranged to have a space and a symmetrical plane therebetween for storing a coolant. Each of the first and second torus coolant containers includes therein a main coil bobbin with a main coil for generating a measurement magnetic field, a shield coil bobbin with a shield coil for generating a shielding magnetic field for suppressing outside leak of the measurement magnetic field, a plate member vertically reinforced at a plane thereof opposite to a plane thereof facing the symmetrical plane for supporting the shield coil bobbin and the main coil bobbin. The main coil bobbin is further supported by the shield coil bobbin, to cause the main coil to generate the measurement magnetic field having a substantially uniform magnetic field intensity at a middle region of the space. A magnetic resonance imaging apparatus using the superconducting magnet is also disclosed.

22 Claims, 9 Drawing Sheets

U.S. PATENT DOCUMENTS

| | | | |
|---|---|---|---|
| 5,691,678 A * | 11/1997 | Gore et al. | 335/216 |
| 5,982,260 A * | 11/1999 | Byrne | 335/216 |
| 6,011,454 A * | 1/2000 | Huang et al. | 335/216 |
| 6,078,234 A * | 6/2000 | Huang et al. | 335/216 |
| 6,147,579 A * | 11/2000 | Einziger et al. | 335/299 |
| 6,150,912 A * | 11/2000 | Elgin et al. | 335/299 |
| 6,289,681 B1 * | 9/2001 | Eckels et al. | 62/47.1 |
| 6,570,475 B1 * | 5/2003 | Lvovsky et al. | 335/216 |
| 6,864,770 B2 * | 3/2005 | Nemoto et al. | 335/216 |
| 6,914,431 B2 * | 7/2005 | Havens | 324/318 |
| 6,937,126 B1 * | 8/2005 | Kruip et al. | 335/296 |
| 2002/0180571 A1 * | 12/2002 | Takeshima et al. | 335/216 |
| 2003/0155998 A1 * | 8/2003 | Takeshima et al. | 335/299 |
| 2004/0100261 A1 | 5/2004 | Laskaris et al. | |

* cited by examiner

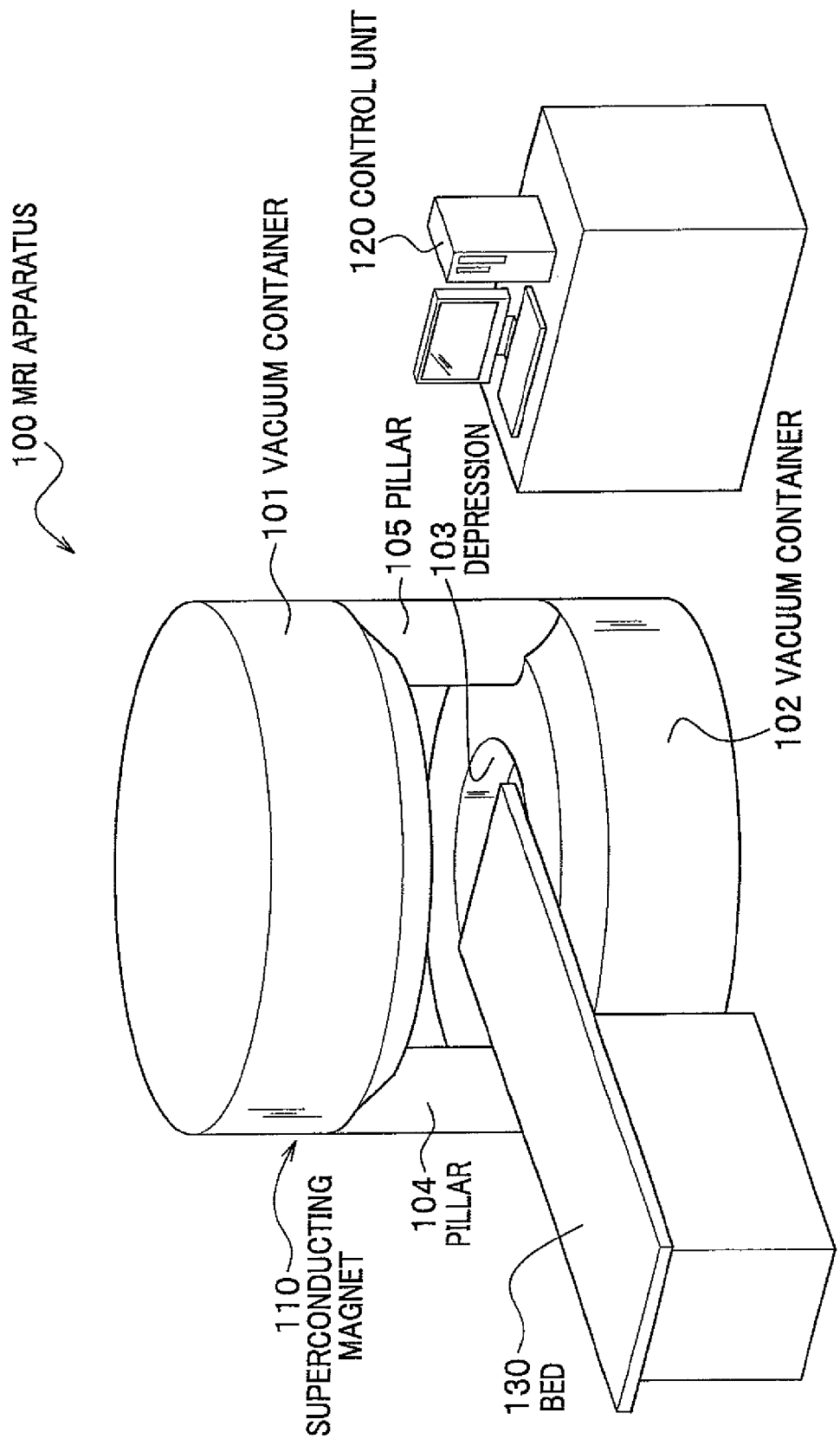

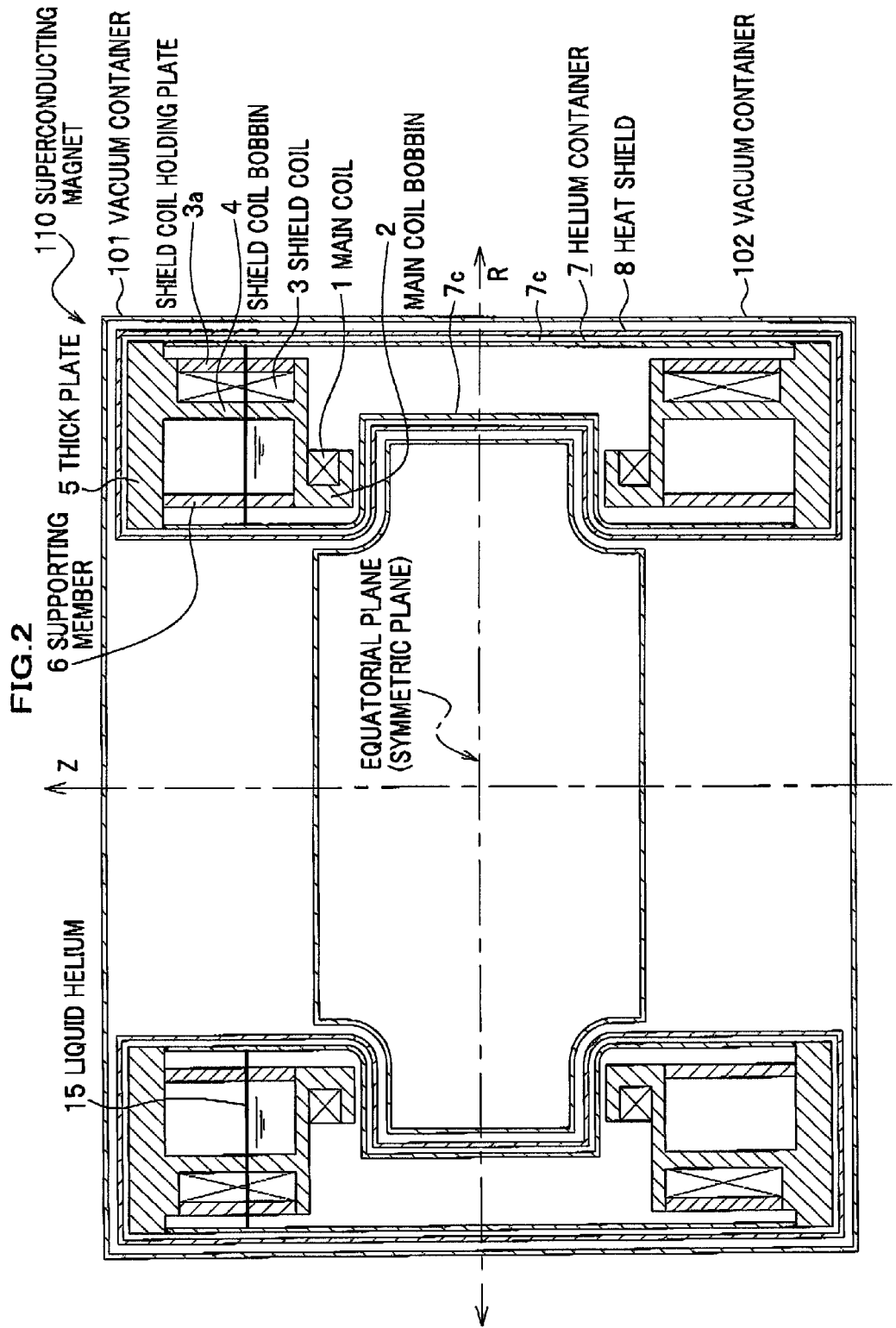

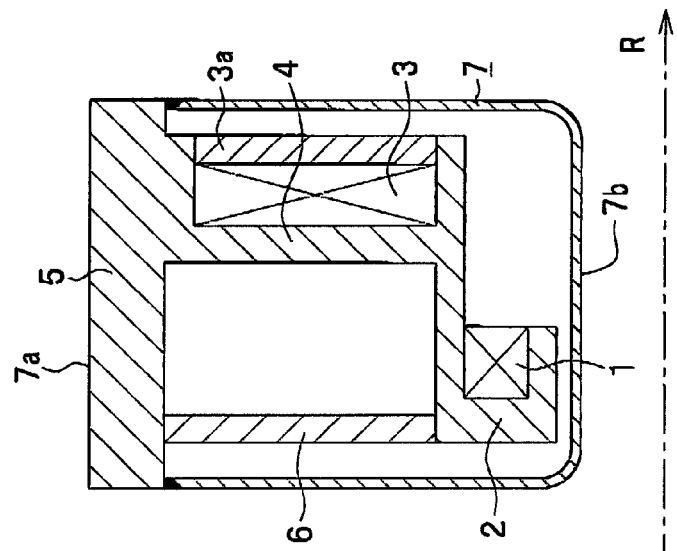
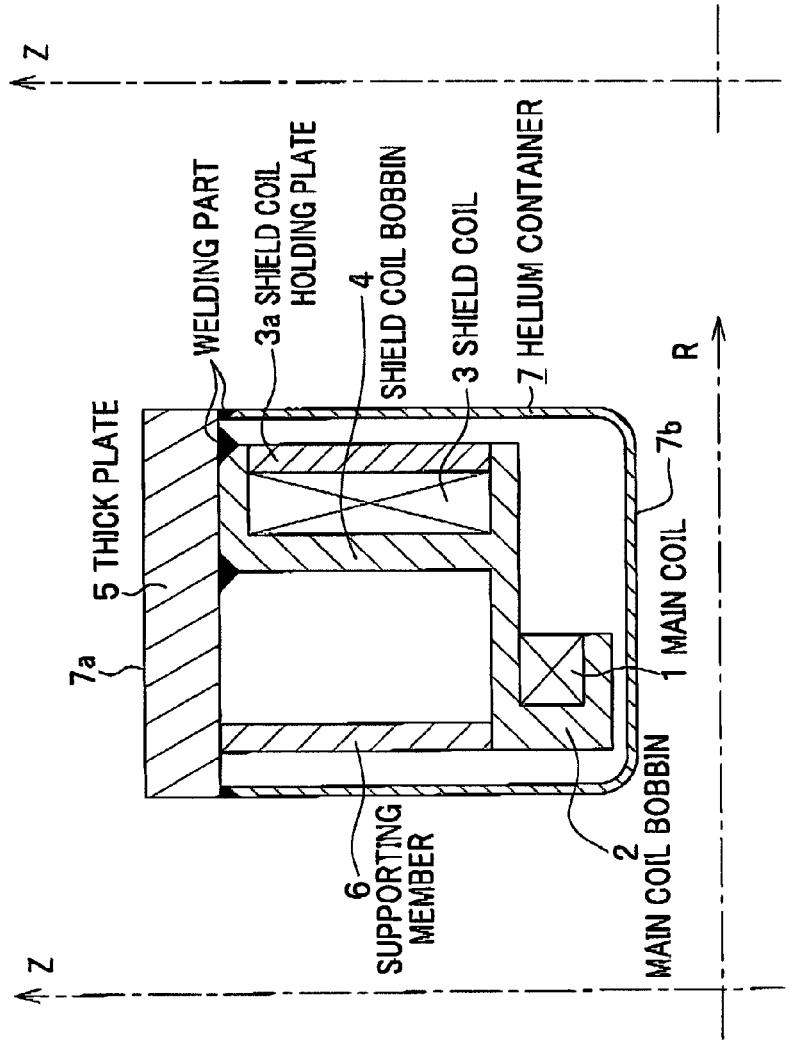
FIG. 3A
FIG. 3B

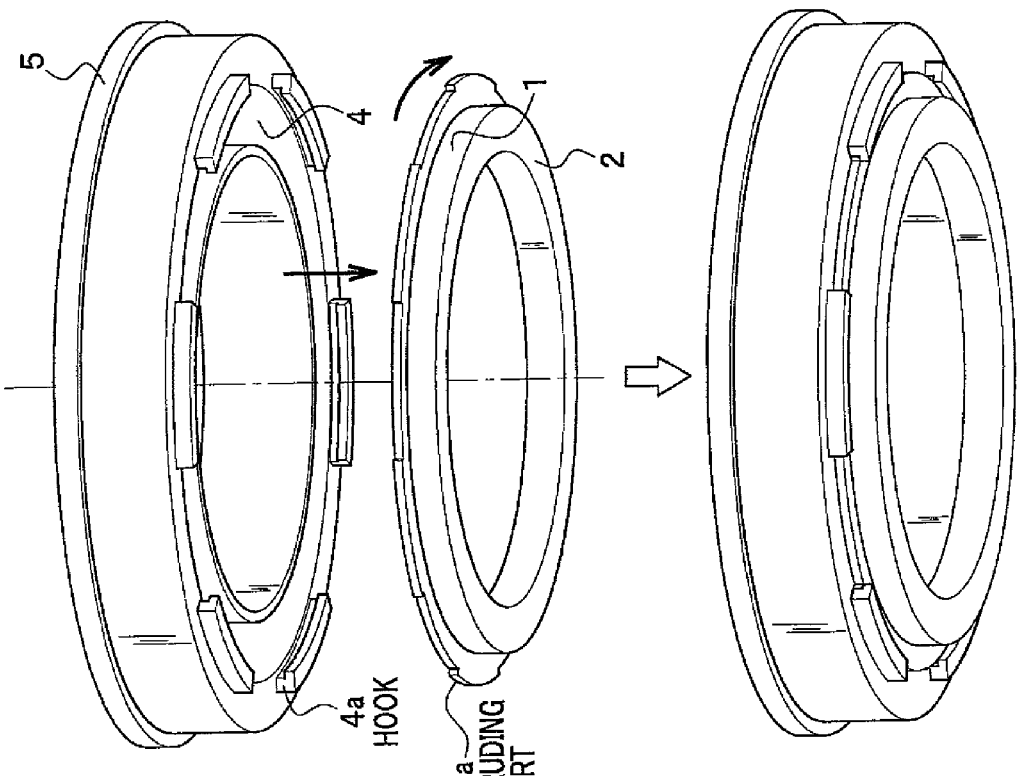
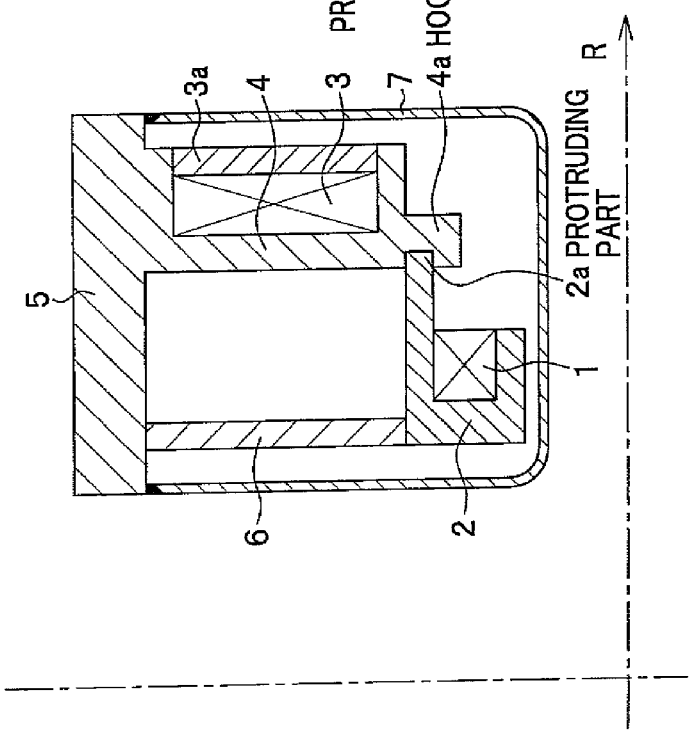

SUPERCONDUCTING MAGNET AND MAGNETIC RESONANCE IMAGING APPARATUS USING THE SAME

CROSS REFERENCE TO RELATED APPLICATIONS

The present application claims benefit of the filing date of Japanese patent application No. 2006-000834 filed on Jan. 5, 2006, and Japanese patent application No. 2006-190146 filed on Jul. 11, 2006, which are incorporated herein by reference.

FIELD OF THE INVENTION

The present invention relates to a superconducting magnet and a magnetic resonance imaging apparatus using the same.

DESCRIPTION OF THE RELATED ART

An open type of MRI (Magnetic Resonance Imaging) apparatus free from a closed sensation is known. The open type of MRI apparatus includes torus helium containers filled with liquid helium symmetrically, vertically arranged to provide a space for a measurement subject and bobbins (coil bobbins) with superconducting coils housed therein, respectively.

Such an MRI apparatus generally has a structure in which a supporting member supports the coil bobbins, and the supporting member and the coil bobbins are all covered with the helium containers. In this structure, generally, spatial dimensions become large. Particularly, the vertical dimension becomes large because the coil bobbins and the supporting member are vertically stacked. When the vertical dimension of the MRI apparatus becomes large, a special attention in installing the MRI apparatus may be required. For example, a height of a ceiling of a sealed room for installing the MRI apparatus should be increased. In addition, in carrying the MRI apparatus on roads and into the sealed room, a similar attention should be paid. In other words, MRI apparatus having a large size is costly in carrying the MRI apparatus on roads and into the sealed room and installing the same in the sealed room.

Further, when the coil bobbins are mounted on the supporting member, generally the coil bobbins are welded on the supporting member. In this case, (1) an electrical conductive characteristic decreases because a distortion occurs due to deformation generated during welding, and (2) the electrical conductive characteristic decreases because an impregnated resin for the coils and superconducting wires deteriorate due to heat generated during welding.

U.S. Pat. No. 5,982,260 (FIGS. 1 and 2), which is incorporated herein by reference, discloses an example of structures of the helium containers and the coil bobbins for the open type of MRI apparatus. In this example, the coil bobbin is housed in a helium container having a thin wall, and the helium containers and the coil bobbins are supported by the supporting structure through supporting members. In this case, the electrical conductive characteristic does not decrease due to welding because the coil bobbin is not directly welded on the supporting structure.

SUMMARY OF THE INVENTION

An aspect of the present invention provides a superconducting magnet and a magnetic resonance imaging apparatus using the same, the superconducting magnet including: first and second torus coolant containers substantially symmetrically, vertically arranged to have a space and a symmetrical plane therebetween for storing a coolant, each of the first and second torus coolant containers including therein a main coil bobbin with a main coil for generating a measurement magnetic field, a shield coil bobbin with a shield coil for generating a shielding magnetic field for suppressing outside leak of the measurement magnetic field, a plate member vertically reinforced at a plane thereof opposite to a plane thereof facing the symmetrical plane for supporting the shield coil bobbin and the main coil bobbin, wherein the main coil bobbin is further supported by the shield coil bobbin, to cause the main coil to generate the measurement magnetic field having a substantially uniform magnetic field intensity at a middle region of the space.

According to the aspect of the invention, a part of each of the first and second coolant containers is formed with a plate member which also serves as a wall of the coolant container. This may eliminate the necessity of special supporting members for the first and second coolant containers. This suppresses a total weight of the super conducting magnet and a vertical dimension of the magnetic resonance image apparatus in the superconducting magnet. In addition, the main coil bobbin is supported by the shield coil bobbin in addition to the plate member. This may suppress deformation of the coils and provide a stable measurement field formation.

In addition, according to the present invention, the main coil bobbin may be connected to the shield coil bobbin without welding, but using a holder or the like for holding the main coil bobbin and the shield coil bobbin to suppress deformation which may occur in welding.

BRIEF DESCRIPTION OF THE DRAWINGS

The object and features of the present invention will become more readily apparent from the following detailed description taken in conjunction with the accompanying drawings in which:

FIG. 1 is an outline perspective view of an MRI apparatus using a superconducting magnet according to embodiments of the present invention;

FIG. 2 is a cross-sectional view of the superconducting magnet for the MRI apparatus shown in FIG. 1, taken on a plane at pillars thereof according to the embodiments of the present invention;

FIGS. 3A and 3B are cross-sectional views of a main coil bobbin and a shield coil bobbin according to a first embodiment, taken on a plane vertical to a circumferential direction of the torus helium container;

FIG. 5A is a cross-sectional view of the main coil bobbin and the shield coil bobbins according to a third embodiment, taken on a plane vertical to the circumferential direction of the torus helium container;

FIG. 5B is a perspective view showing an assembling process of parts including the shield coil bobbin and the main coil bobbin according to the second embodiment;

The same or corresponding elements or parts are designated with like references throughout the drawings.

DETAILED DESCRIPTION OF THE INVENTION

Figure 4:
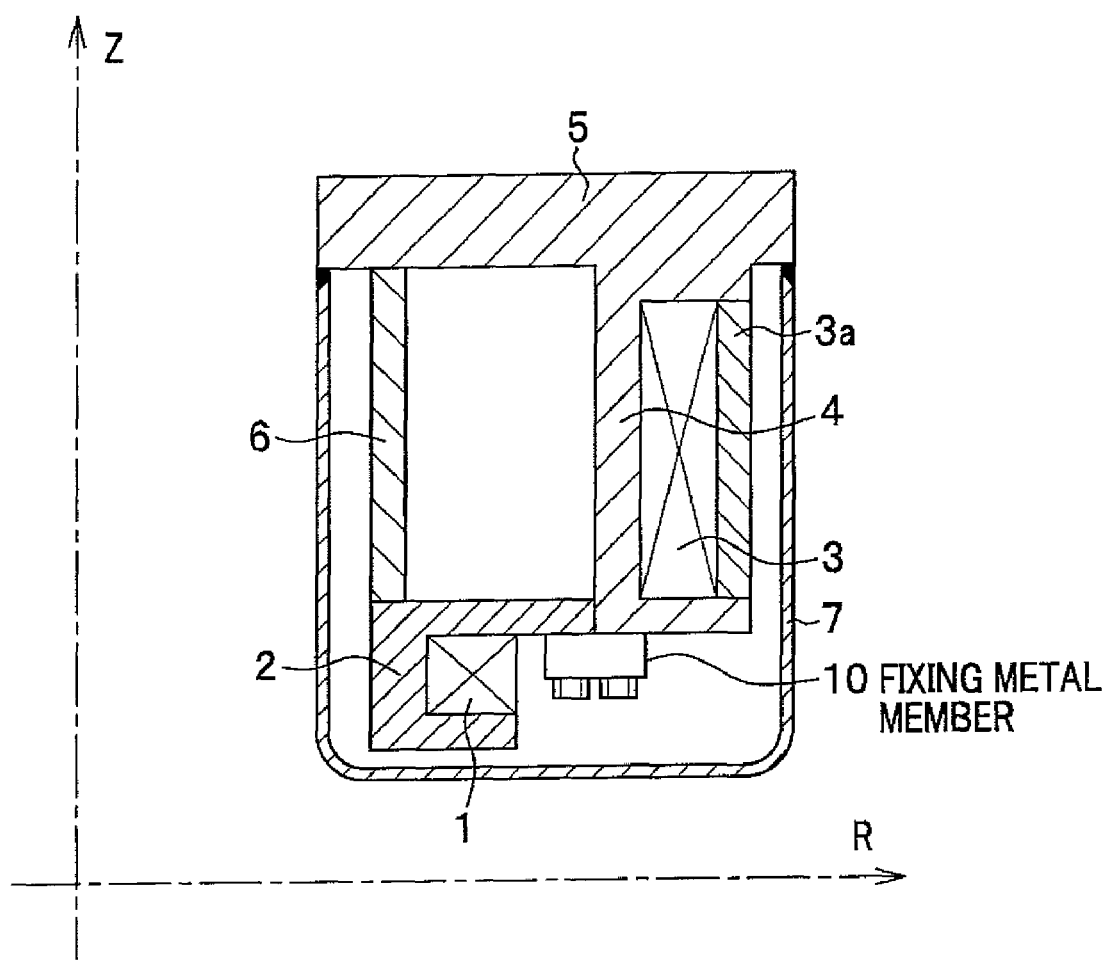
FIG. 4 is a cross-sectional view of the main coil bobbin and the shield coil bobbin according to a second embodiment, taken on a plane vertical to the circumferential direction of the torus helium container.

Prior to describing an embodiment of the present invention, the above-mentioned related art will be further explained.

In the MRI apparatus disclosed in U.S. Pat. No. 5,982,260, spatial dimensions of the MRI apparatus 100 generally become large because the helium container is provided discretely from the supporting structure for supporting the helium containers and the coil bobbins.

In addition, because the coil bobbin is supported using the supporting member in which a thin wall of the helium container 7 is sandwiched between the structural supporting member and the coil bobbin, this structure cannot efficiently withstand an electromagnetic force applied to the coil bobbin. This requires a sufficient stiffness in the coil bobbin, so that a diameter of the coil bobbin may become larger or require additional members for increasing the stiffness, resulting in increase in the weight.

The present invention provides a superconducting magnet capable of efficiently withstanding the electric magnetic force applied to the coil bobbin by the supporting structure having a sufficient stiffness. The present invention provides a superconducting magnet including coil bobbins and helium containers capable of suppressing decrease in the electrical conductive characteristic of the super conducting coil due to deformation and heat generated during welding. The present invention provides an MRI apparatus capable of suppressing a vertical dimension and a weight.

Hereinafter with reference to drawings will be described embodiments of the present invention.

First Embodiment

FIG. 1 shows an outline of an MRI apparatus employing a superconducting magnet according to an exemplary embodiment of the present invention. FIG. 2 shows a cross-sectional structure of the superconducting magnet including pillars of the MRI apparatus shown in FIG. 1.

As shown in FIG. 1, the MRI apparatus 100 includes two torus vacuum containers 101 and 102 vertically spaced in a symmetrical manner, connected to each other through pillars 104 and 105 for supporting the vacuum container 101. The space between the torus vacuum containers 101 and 102 is provided for measurement by the MRI apparatus 100 and allows a tip of a bed 130 supporting a subject such as a patient to be inserted thereinto.

The insides of the vacuum containers 101 and 102 are kept in vacuums with air-tight sealing to prevent heat from invading thereinto due to conduction and convection. The vacuum containers 101 and 102 house a coolant container (hereinafter referred to as a helium container 7) with which liquid helium 15 is filled. Thus, the coolant container 7 has a sealing for storing liquid helium. The sealing may be welding shown in FIG. 3B at junctures between the thick plate 5 and the side walls of the helium container 7 or other substances for sealing having a resistance to a low temperature. The helium container 7 houses main coil bobbins 2 for housing main coils 1 and shield coil bobbins 4 for housing shield coils 3 therein. The main coils 1 are superconducting coils for generating a magnetic field for measurement in the measurement space of the MRI apparatus 100, and the shield coils 3 are superconducting coils for generating a magnetic field for canceling the magnetic field for measurement which may externally leak. Provided between the vacuum containers 101 and 102 and the helium container 7 is a heat shield 8 for shielding heat radiation to the vacuum containers 101 and 102.

The vacuum containers 101 and 102 in addition to the heat shield 8, the helium container 7, the main coils 1, the main coil bobbins 2, the shield coils 3, and the shield coil bobbins form the superconducting magnet 110. The helium container 7 is in a torus shape, namely, an annular tube having a substantially circular or substantially rectangular cross section. The helium container 7 having upper and lower parts which are vertically arranged inside the upper vacuum container 101 and the lower vacuum container 102 in a symmetrical manner in which the upper part communicates with the lower part through the pillars 104 and 105. The helium container 7 is partially formed with thick plates 5 vertically reinforced functioning as structural supporting members according to the present invention in addition to as walls of the helium container 7. This structure will be described later with reference to FIG. 3 and drawings having following drawing numbers.

The thick plate 5 has a vertical stiffness for supporting the main coil bobbin 2 and the shield coil bobbin 4 in addition to holding the shape of the helium container 7. In the embodiments of the present invention, a vertical thickness of the thick plate 5 is greater than thicknesses of other planer parts including the supporting member 6 and vertical walls 7c of the helium container 7. The thick plate 5, the main coil bobbin 2, the shield coil bobbin 4, and the like in the upper part of the helium container 7 are supported by the vertical walls 7c of pillars 104 and 105 of the helium container 7.

In addition to the thick plate 5 used for the supporting member, the main coil bobbins 2, the shield coil bobbins 4, the helium container 7, and the vacuum containers 101 and 102 are formed of a non-magnetic material such as austenitic stainless steel.

In FIG. 2, the coordinate indicated by "Z" shows the vertical direction of which origin is defined by a symmetric plane in which the vacuum containers 101 and 102 or the upper and lower parts of the torus helium container 7 are vertically, substantially symmetrically arranged. The symmetric plane may be frequently referred to as an equatorial plane. The coordinate indicated by "R" represents a coordinate in radial direction in polar coordinate representation, wherein a center of the torus vacuum containers 101 and 102 (or a center of the torus helium container 7) is defined as an origin.

Returning to FIG. 1, at the middle of the space for measurement between the upper and lower vacuum containers 101 and 102 is generated a uniform magnetic field in the vertical direction. In the MRI apparatus 100, a subject body is placed in the uniform magnetic field generated in the vertical direction to obtain a tomographic image by using magnetic resonance in the subject body. For this, provided at middles of the vacuum containers 101 and 102 are depressions 103 where a gradient coil and an RF (Radio Frequency) coil (both not shown) are installed. Further, a control unit 120 including a computer is installed to analyze the obtained magnetic resonance signal, generating the tomographic image of the subject body to display the tomographic image and the like on a display device.

FIGS. 3A and 3B show cross-sectional views of the helium container 7 according to the first embodiment taken on a plane perpendicular to circumferential direction of the torus helium container 7. FIG. 3A shows an example of a structure in which the shield coil bobbin 4 and the main coil bobbin 2 are integrally molded and welded on the thick plate 5 as the structural supporting member. FIG. 3B shows an example of a structure in which the thick plate 5 as the supporting member, the shield coil bobbin 4, and the main coil bobbin 2 are integrally molded.

As shown in FIG. 3A, a plane (wall) of the helium container 7, i.e., a wall 7a opposite to a plane (wall 7b) facing the equatorial plane R of the helium container 7, is provided by the thick plate 5. In this case, the shield coil bobbin 4 and the main coil bobbin 2 are integrally molded by casting or the like. The shield coil bobbin 4 is fixed to the thick plate 5 by welding or the like. The main coil bobbin 2 at one end is supported by the shield coil bobbin 4 and at the other end is fixed to the thick plate 5 through a supporting member 6. The supporting member 6 may be integrally molded with the thick plate 5 or integrally molded with the shield coil bobbin 4 and the main coil bobbin 2. FIG. 3A shows an example in which the supporting member 6 is integrally molded with the shield coil bobbin 4 and the main coil bobbin 2. Further, the shield coil bobbin 4 is provided with a shield coil holding plate 3a for preventing the shield coil 3 from bursting outside. The shield coil holding plate 3a is fixed to the shield coil bobbin 4, for example, by shrink fitting.

In the embodiment, the thick plate 5 serves as the structural supporting member for the main coil 1 and the shield coil 3. In other words, the thick plate 5 operates to provide stiffness for withstanding the electromagnetic force acting on the main coil 1 and the shield coil 3. Further, the thick plate 5 serves as a part (wall) of the helium container 7. More specifically, the thick plate 5 is used as both a part of the helium container 7 and the structural supporting member, and thus is superior in decreasing the number of parts and decreasing the height thereof, and a weight, and in decreasing a manufacturing cost.

Further, the main coil 1 receives a reaction force from the shield coil 3 and a force directed to the equatorial plane because the main coil 1 receives an attraction force from the main coil 1 on the opposite side of the equatorial plane. Thus, the other main coil 1 is required to withstand forces acting in the vertical direction. In the embodiment, the thick plate 5 and the shield coil bobbin 4 withstand the forces, so that a displacement of the main coil 1 can be effectively suppressed by using the stiffness of the entire of the thick plate 5.

In addition influence of heat on the main coil 1 and the shield coil 3 during fixing the main coil bobbin 2 and the shield coil bobbin 4 to the thick plate 5 or the like by welding can be prevented by winding these coils after welding. In this case, the helium container 7 is welded after winding the main coil 1 and the shield coil 3. However, a heat capacity of the thick plate 5 is large and its stiffness is large, which prevents the main coil 1 and the shield coil 3 from being deteriorated or deformed by the heat transmitted from the parts being welded of the helium container 7. At least the temperature increase in the main coil 1 and the shield coil 3 can be suppressed down to a trouble less level.

FIG. 3B shows an example of the main coil bobbin 2 and the shield coil bobbin 4 integrally molded with the thick plate 5 by casting. In this case, the supporting member 6 may be integrally molded. However, the supporting member 6 may be fixed to the main coil bobbin 2 and the thick plate 5 by welding or bolt-fastening.

In FIGS. 2, 3A, and 3B, only one main coil 1 and only one main coil bobbin 2 are shown for each of the torus vacuum containers 101 and 102. However, a plurality of the main coils 1 and the main coil bobbins 2 may be provided in accordance with the structure of the superconducting magnet 110. This is applicable to the shield coil 3 and the shield coil bobbin 4. Throughout the specification, for simplification a single main coil 1 and a single shield coil 3 are described for each of the torus vacuum containers 101 and 102.

Second Embodiment

FIG. 4 shows an example of a cross-sectional structure according to a second embodiment, viewed when the torus helium container 7 is cut on the plane perpendicular to circumferential direction thereof. The superconducting magnet 110 and the MRI apparatus 100 according to the second embodiment are substantially the same as those according to the first embodiment. In this and the following embodiments, the same parts as those in the first embodiment are designated with the same references and thus detailed descriptions will be omitted.

As shown in FIG. 4, in the second embodiment, the shield bobbin 4 is integrally molded with the thick plate 5 by casting or the like, but the main coil bobbin 2 are molded discretely from the thick plate 5. The main coil bobbin 2 is fixed to the shield coil bobbin 4, for example, with a fixing metal member 10 and bolts. The supporting member 6 may be molded integrally with the coil bobbin 2 and may be welded to the thick plate 5 at juncture or connected to the thick plate 5 by fastening bolts.

As mentioned above, the main coil bobbin 2 is molded as a desecrate member, and then fixed to the shield coil bobbin 4 and the thick plate 5. This may increase a degree of freedom in a relative positional arrangement between the main coil bobbin 2 and the shield coil bobbin 4 or may improve flexibility or operability in processes. For example, the main coil bobbin 2 is connected to the shield coil bobbin 4 after winding of the main coil 1. This allows the main coil bobbin 2 to be arranged at such a position as to be hidden behind the shield coil bobbin 4 when viewed from the circumferential direction.

Generally, it is undesirable to weld the main coil bobbin 2 to the shield coil bobbin 4 after winding from the viewpoint of distortion in and thermal influence on the coil. This is because the distortion in or the thermal influence to the main coil 1 and the shield coil 3 may decrease an upper limit current. In the second embodiment, the main coil bobbin 2 is connected to the shield coil bobbin 4 with the fixing metal member 10, which eliminates such a problem.

As mentioned above, according to the second embodiment, the main coil bobbin 2 after winding can be connected to the shield coil bobbin 4 free from the distortion or the deterioration in the main coil 1 and the shield coil 3 due to heat. In addition, the flexibility in the positional arrangement between the main coil bobbin 2 and the shield coil bobbin 4 is increased with improvement in the operability in manufacturing.

Third Embodiment

FIG. 5A shows an example of a cross-sectional structure according to a third embodiment. FIG. 5B is a perspective view showing an assembling process of parts including the shield coil bobbin 4 and the main coil bobbin 2.

In the third embodiment, as shown in FIGS. 5A and 5B, the main coil bobbin 2 has a plurality of (for example, six) protruding parts 2a equi-distantly arranged on an outer circumference thereof. On the other hand, a face of the shield coil bobbin 4 on a side of the equatorial plane, i.e., a bottom face thereof in FIG. 5B, has hooks 4a (of which the number as that of the protruding parts 2a) for allowing the protruding parts 2a spaced at the same distance on an outer circumference thereof to be fitted in recesses of the hooks 4a for fixing.

In this structure, a sum of a pair of the protruding parts 2a and the hooks 4a in length is shorter than an interval (pitch) of two adjacent hooks 4a. For example, if six protruding parts 2a and six hooks 4a are formed, the interval is 60 degrees. This allows the protruding part 2a and hook 4a to have lengths corresponding to 29 degrees, respectively. However, it is unnecessary that the protruding part 2a and hook 4a have the same length.

The protruding parts 2a on the main coil bobbin 2 can be integrally molded with the main coil bobbin 2 by casting. Similarly, the hook 4a of the shield coil bobbin 4 can be integrally molded with the shield coil bobbin 4 by casting. Further, the supporting member 6 can be integrally molded with the main coil bobbin 2. In this case, the supporting member 6 can be connected to the thick plate 5 at a juncture by welding.

Next, the main coil bobbin 2 and the shield coil bobbin 4 are arranged such that the protruding parts 2a of the main coil bobbin 2 are alternately positioned with the hooks 4a of the shield coil bobbin 4. After vertical movement to have contact, the main coil bobbin 2 is rotated in the circumferential direction thereof to fit the protruding parts 2a of the main coil bobbin 2 into the hooks 4a of the shield coil bobbin 4. This connects the main coil bobbin 2 and the shield coil bobbin 4.

This structure eliminates the necessity of the fixing metal member 10 for connecting the main coil bobbin 2 to the shield coil bobbin 4 in the second embodiment. This reduces the number of parts and the number of processes of assembling and thus effectively reduces the manufacturing cost. In addition, in this case, welding is unnecessary to connect the main coil bobbin 2 to the shield coil bobbin 4. Thus, the main coil bobbin 2 and the shield coil bobbin 4 after winding can be connected to each other without the distortion and the deterioration by heat in the main coil 1 and the shield coil 3.

Fourth Embodiment

Figure 6:
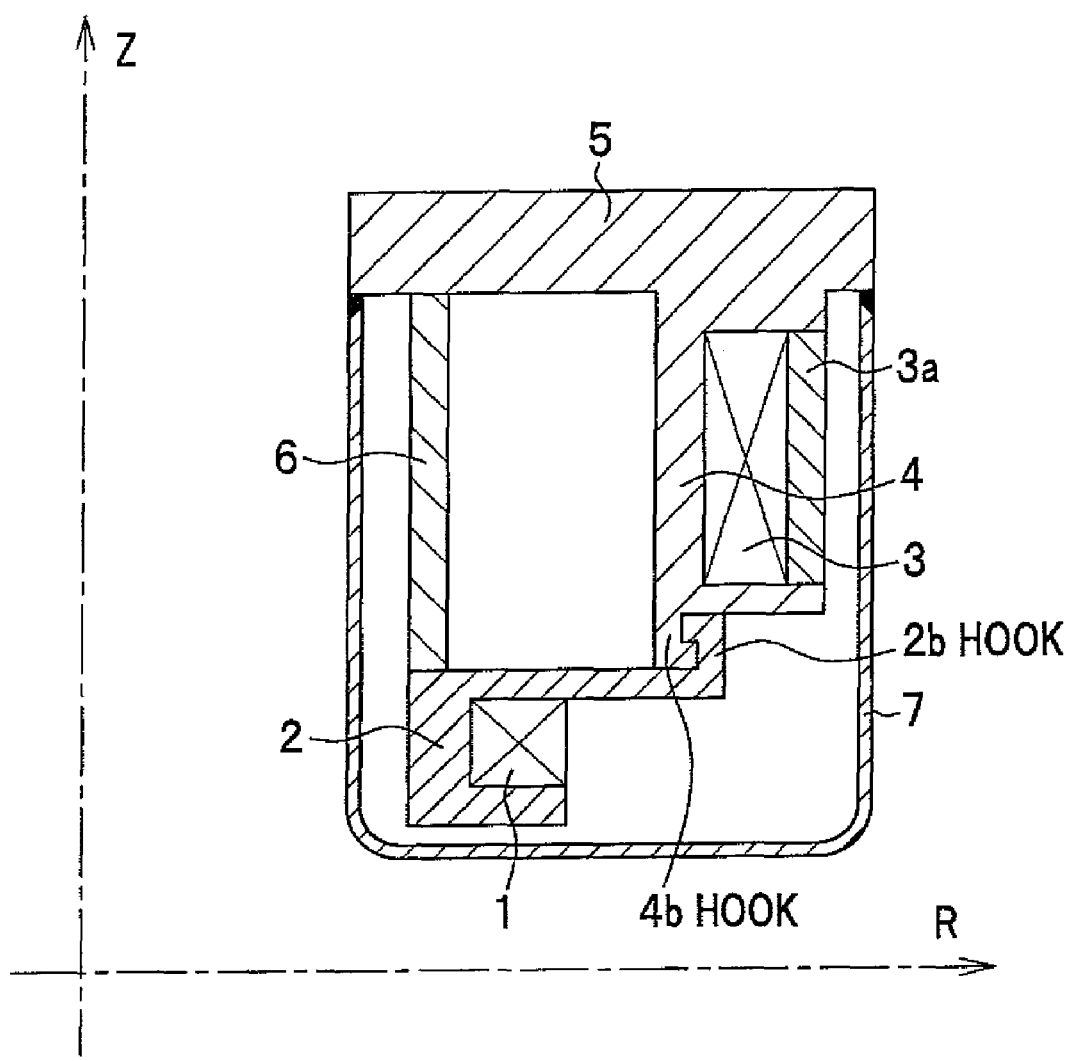
FIG. 6 is a cross-sectional view of the main coil bobbin and the shield coil bobbin according to a fourth embodiment, taken on a plane vertical to the circumferential direction of the torus helium container.

FIG. 6 shows an example of a cross-sectional structure according to a fourth embodiment, viewed when the torus helium container 7 is cut on a plane perpendicular to circumferential direction thereof. This embodiment is a modification of the third embodiment.

As shown in FIG. 6, a hook 2b is formed on an outer circumference of the main coil bobbin 2 on a plane thereof opposite to the equatorial plane to have an opening (channel) inwardly directed regarding radial direction of the torus helium container 7. Further, formed on a surface of the shield coil bobbin 4 facing the equatorial plane is a hook 4b having an opening (channel) outwardly directed regarding the radial direction of the torus helium container 7. These hooks 2b and 4b can be fit into each other. In the fourth embodiment, the hook 2b and the hook 4b may be formed partially or across all circumferences of the main coil bobbin 2 and shield coil bobbin 4.

In the fourth embodiment, the main coil bobbin 2 is fixed to the shield coil bobbin 4 by shrink fitting. More specifically, the main coil bobbin 2 is heated to expand to make the radius of the annular shape large to allow the hook 2b to loosely fit into the channel of the hook 4b of the shield coil bobbin 4. After that, cooling the main coil bobbin 2 for contraction allows the hooks 2b and 4b to fit into tightly each other. This connects the main coil bobbin 2 to the shield coil bobbin 4.

Because the shrink fitting is performed at 400° C. to 500° C., winding on the main coil bobbin 2 is generally performed after the shrink fitting. In the fourth embodiment, the main coil bobbin 2 after winding cannot be connected to the shield coil bobbin 4. However, except this point the superconducting magnet operates similarly to the third embodiment.

Fifth Embodiment

Figure 7A:
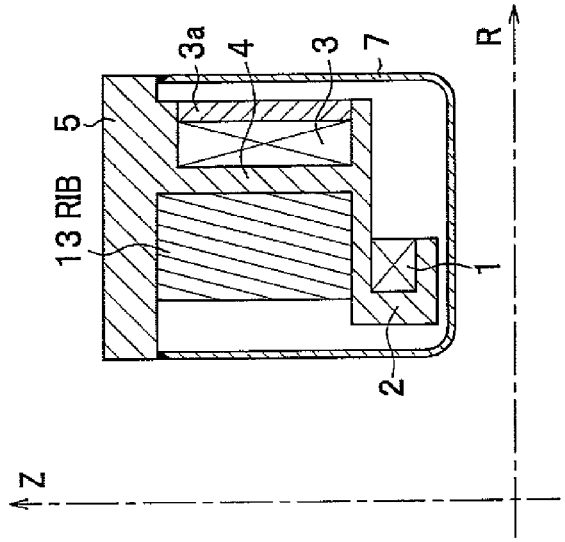
FIGS. 7A to 7C are cross-sectional views of examples of the main coil bobbins and the shield coil bobbins according to a fifth embodiment, taken on planes vertical to the circumferential direction of the torus helium container.
Figure 7B:
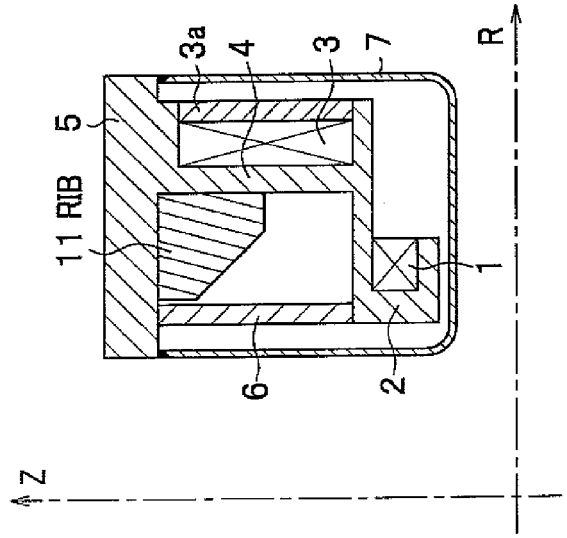
Figure 7C:
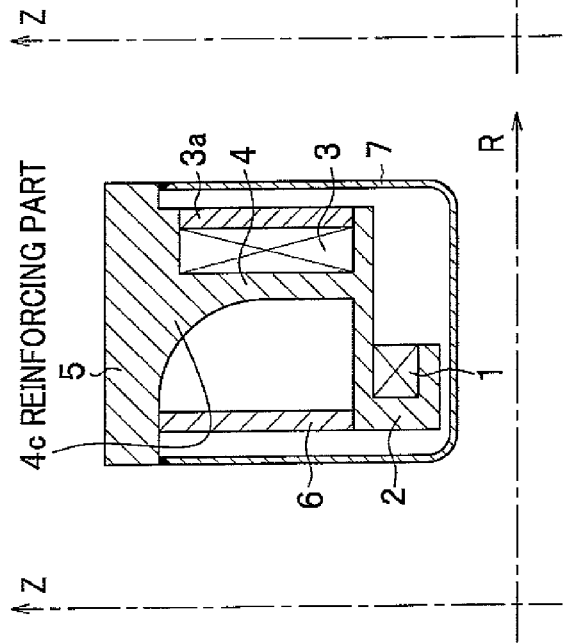

FIGS. 7A to 7C show cross-sectional structures of the helium container 7 according to the fifth embodiment cut on the plane perpendicular to circumferential direction of the torus helium container 7. FIG. 7A shows an example of the structure in which the shield coil bobbin 4 has overhang parts 4c inwardly extending from an inner circumferential wall of the shield coil bobbin 4. FIG. 7B shows an example of a structure in which ribs 11 having slant edges are provided to connect the inner circumferential wall of the shield coil bobbin 4 to the thick plate 5 to support the thick plate 5. FIG. 7C shows an example of a structure in which ribs 13 having a rectangular shape are provided to connect the inner circumferential wall of the shield coil bobbin 4 to the thick plate 5 to support the thick plate 5.

As shown in FIG. 7A, in the fifth embodiment, the shield coil bobbin 4 is provided with the overhang parts 4c inwardly extending from an inner circumferential wall of the shield coil bobbin 4. The reinforcing parts 4c are also provided for the thick plate 5 to increase the stiffness of the thick plate 5 as the structural supporting member. In addition, it is unnecessary to provide the reinforcing parts 4c across the entire circumference of the torus helium container 7. The reinforcing parts 4c may be provided only on partial regions of the inner circumferential wall of the shield coil bobbin 4 or may be provided to have a thickness depending to a circumferential position.

Generally, in the superconducting magnet 110 in the open type of MRI apparatus 100 shown in FIGS. 1 and 2, the upper and lower main coils 2 and shield coils 4 generate attracting electromagnetic forces acting therebetween. The main coils 2 and the shield coils 3 at the upper and lower part of the helium container 7 are supported by the thick plates 5 as the structural supporting members. The thick plates 5 are supported by the pillars 104 and 105. Thus, the thick plate 5 as the structural supporting member may have flexure increasing in going apart from the pillars 104 and 105. This may deform the main coil bobbin 2 and the shield coil bobbin 4, generating distortion in the main coil 1 and the shield coil 3. In this case, the MRI apparatus 100 cannot generate a uniform magnetic field at the middle of the measurement space.

In the fifth embodiment, for example, the reinforcing parts 4c have thick parts around the pillars 104 and 105 in which the thickness of the reinforcing parts 4c gradually decreases in going apart from the pillars 104 and 105. The reinforcing parts 4c can be integrally molded with the thick plate 5, the shield coil bobbin 4, and the like, for example, by casting.

The reinforcing parts 4c thus molded increases stiffness of the thick plate 5 as the structural supporting member not only due to increase in the thickness but also due to a mechanism similar to those operating in an arch bridge and a suspension bridge. This can reduce flexure at positions apart from the pillars 104 and 105. This allows the MRI apparatus 100 to generate a uniform magnetic filed more accurately at the middle of the measurement space of the MRI apparatus.

Figure 8:
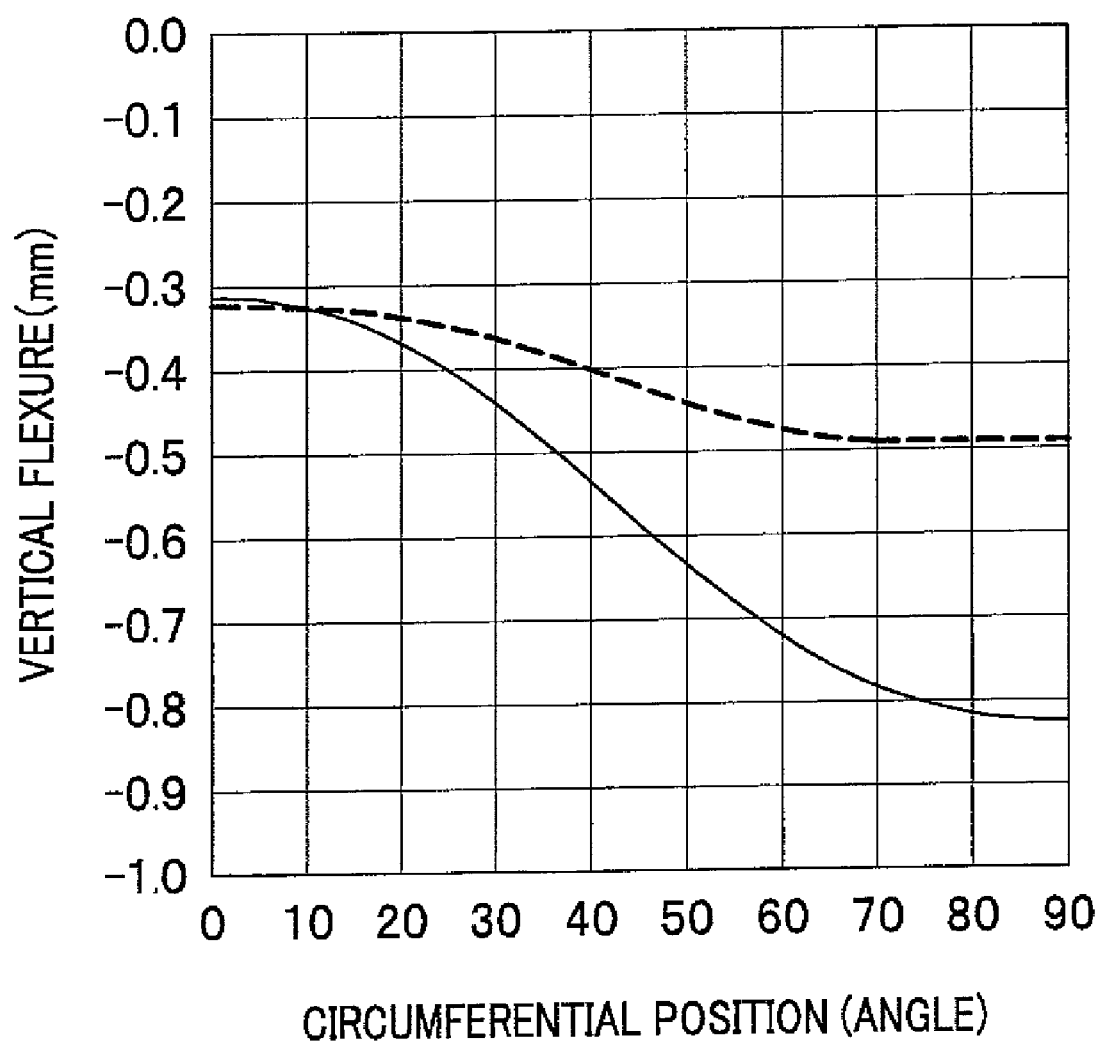
FIG. 8 is a graphical chart showing an example of a result of variation in flexure in the main coil bobbin of the torus helium container according to the fifth embodiment.

FIG. 8 shows an example of a calculation result of variation in a quantity of flexure of the main coil bobbin 2 of the torus helium container according to the fifth embodiment obtained through simulation. In FIG. 8, the ordinate of the chart represents the quantity of flexure in the main coil bobbin 2, namely, a quantity of vertical deformation. The abscissa represents a circumferential position in an angle apart from the pillars 104 and 105 as origins. In FIG. 8, a solid line represents the flexure in a case that the reinforcing parts 4c are not formed. The broken line represents the flexure in a case that the reinforcing parts 4c are formed. FIG. 8 shows that the reinforcing parts 4c largely reduce flexure in the main coil bobbin 2.

FIG. 7B shows a modification of the example in FIG. 7A. In FIG. 7B, in place of the reinforcing parts 4c, provided on the inner circumferential wall of the shield coil bobbin 4 are ribs 11 for connection to the thick plate 5. In this structure, the ribs 11 can be fixed to the thick plate 5 and the shield coil bobbin 4 by welding or bolt-fastening. The rib 11 functions similarly to the reinforcing part 4c. Thus, it is unnecessary to arrange the ribs 11 across the entire circumference of the helium container 7, but the ribs 11 are provided at partial regions or may be provided discretely arranged in the circumferential direction on the inner circumferential wall of the shield coil bobbin 4. Further, a shape or size of the rib 11 may be changed based on the circumferential position. The resulting stiffness is similar to that provided by the reinforcing part 4c.

FIG. 7C shows a modification of the structure shown in FIG. 7B. In FIG. 7C, in place of the supporting member 6 and the ribs 11 in FIG. 7B, ribs 13 are provided in a rectangular shape to be connected to the thick plate 5 and an upper of the main coil bobbin 2. In this case, the ribs 13 can be fixed to the thick plate 5, the shield coil bobbin 4, and the main coil bobbin 2. The ribs 13 may be discretely arranged in a circumferential direction on the inner circumference wall of the shield coil bobbin 4. Further a shape or the size of the cross section may be changed in accordance with the circumferential position. The rib 13 provides a stiffness similar to that provided by the supporting member 6 and the rib 11.

In the fifth embodiment, there are various modifications having the similar operation. For example, a size of the supporting member 6 may be changed in accordance with a circumferential position from the pillars 104 and 105. Further, a thickness of the helium container 7 may be changed in accordance with its positions relative to the pillars 104 and 105. In other words, the modification may be made as long as the stiffness provided in combination of structural members in the helium container 7 is larger around the pillars 104 and 105 and becomes smaller in going apart from the pillars 104 and 105. Further, the modification may be made in such a manner that the stiffness provided in combination of structural supporting members in the helium container 7 is optimized in accordance with its position relative to the pillars 104 and 105 in the circumferential direction of the torus helium container 7.

Sixth Embodiment

Figure 9:
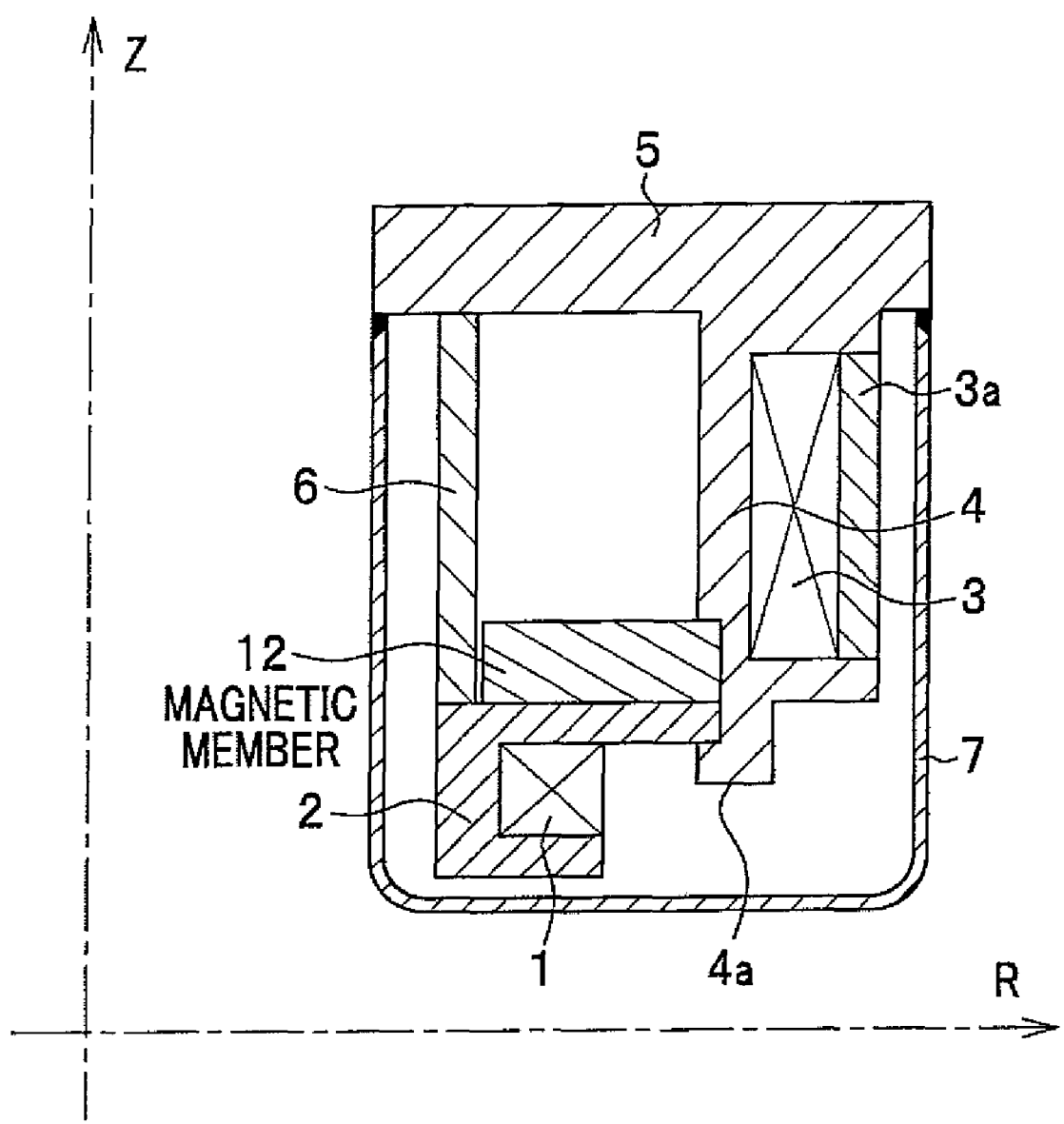
FIG. 9 is a cross-sectional view of the main coil bobbin and the shield coil bobbin according to a sixth embodiment, taken on a plane vertical to the circumferential direction of the torus helium container.

FIG. 9 shows a cross-sectional view of the helium container 7 according to the sixth embodiment cut on the plane perpendicular to circumferential direction of the torus helium container 7. In the sixth embodiment, as shown in FIG. 9, a magnetic member 12 is provided on a surface of the main coil bobbin 2 opposite to the equatorial plane. The magnetic member 12 is provided to decrease an empirical magnetic field of the main coil 1 and compensate the magnetic field at the middle of the measurement space.

Because to the magnetic member 12, an electromagnetic force directed to the equatorial plane generally becomes dominant, the magnetic member 12 can be held by such a structure as to be sandwiched between the main coil bobbin 2 and the shield coil bobbin 4. This structure permits fitting as shown in FIG. 5, so that an assembling process becomes easy. Further, depending on the number of coils in the main coil 1 and a relative positional relation between the main coil 1 and the shield coil 3, the magnetic member 12 may be supported by the thick plate 5 through a metal member or the like.

Further, it is unnecessary that the cross-sectional structure of the magnetic member 12 has the same shape across the entire circumference of the helium container 7, but may vary depending on the circumference position. For example, the cross section of the magnetic member 12 is large around the pillars 104 and 105 and becomes smaller in going apart from the pillars 104 and 105 and vice versa. Further, the magnetic member 12 may be arranged at some regions and not be arranged at other regions.

As mentioned above, according to the sixth embodiments, a uniform magnetic field is accurately generated at the middle of the measurement space of the MRI apparatus 100.

According to the present invention, a stable accurate measurement magnetic field can be generated, and the superconducting magnet and the MRI apparatus in which weight and a vertical dimension can be suppressed.

In the third embodiment, in FIG. 5, the hook 4a is provided on the shield coil bobbin 4. However, the main coil bobbin 2 may be provided with such a hook outwardly protruding, and the shield coil bobbin 4 may be provided with the protrusion 2a inwardly protruding from the shield coil bobbin 4. Between two consecutive hooks 4a a notch part is provided to allow one of the protrusions 2a to enter there and rotates to fit into the channel of the hook 4a. Further the hook 4a has a channel between a lower surface of the shield coil bobbin and the same to allow the proportion 2a to rotatably slide and fit in the channel.

One or more hook 4a may have a length different from the other hooks 4a. The hooks 4a are arranged equi-angle-distantly with the same length and interval. However, the interval of one hook 4a may be different from the other hook 4a, and the length of one hook 4a may be different from the other hooks 4a.

In other words, the main coil bobbin 2 and the shield coil bobbin 4 include a fitting mechanism that fixes the main coil bobbin 2 to the shield coil bobbin 4. The fitting mechanism includes a plurality of pair of protrusion 2a and notches alternately, circumferentially arranged, and a plurality of pair of hooks 4a and hook notches alternately, circumferentially arranged, the protrusion fitting into the hooks. The notches allow the hooks 4a to move therethrough, the hook notches allowing the protrusions 2a to move therethrough, the hooks 4a having channels to allow the protrusions 2a to move toward fitted positions.

Similarly, in the fourth embodiment, as shown in FIG. 6, an end of the hook 4b is outwardly directed, and the hook 2b is inwardly directed. However, this relation can be reversed.

In other words, the main coil bobbin 2 includes a main coil bobbin hook 2b on a surface thereof facing the symmetrical plane, and the shield coil bobbin 4 includes the shield coil bobbin hook 4b on a surface thereof facing the symmetrical plane. Ends of the main coil bobbin hook 2b and the shield coil bobbin hook 4b are directed in opposite radial directions of each of the first and second torus coolant containers 7. The main coil bobbin hook 2b and the shield coil hook 4b have such sizes and locations that the shield coil bobbin hook 4b allows the end of the main coil bobbin hook 2b to vertically (in an assembled state) move beyond the shield coil bobbin hook 4b at a shrink fitting process temperature and fits into the shield coil bobbin hook at the same temperature.

The invention claimed is:

1. A superconducting magnet comprising:
   first and second torus coolant containers substantially symmetrically arranged about a symmetrical plane in a vertical direction to have a space therebetween for storing a coolant and are disposed around a central axis, each of the first and second torus coolant containers including a main coil bobbin with a main coil for generating a measurement magnetic field, a shield coil bobbin with a shield coil for generating a shielding magnetic field for suppressing outside leakage of the measurement magnetic field, and a plate member vertically reinforced for supporting the shield coil bobbin and the main coil bobbin;
   a main coil bobbin supporting member connected to the plate member and the main coil bobbin for supporting the main coil bobbin with respect to the plate member; and
   a pillar comprising a vertical wall for supporting either of the first and second torus coolant containers in the vertical direction,
   wherein the plate member serves as a first wall of a helium container which is opposite to a second wall of the helium container which faces the symmetrical plane, the first and second torus coolant containers communicate with each other through the pillar, and the plate member is supported by the vertical wall,
   wherein the main coil bobbin of each of the first and second torus coolant containers is disposed at a first radial distance from the central axis and the shield coil bobbin of each of the first and second torus coolant containers is disposed at a second radial distance from the central axis, and
   wherein the second radial distance is greater than the first radial distance.

2. The superconducting magnet as claimed in claim 1, wherein the main coil bobbin is connected to the shield coil bobbin with a fixing metal member.

3. The superconducting magnet as claimed in claim 1, wherein the main coil bobbin and the shield coil bobbin include a fitting mechanism that fixes the main coil bobbin to the shield coil bobbin, wherein the fitting mechanism includes a plurality of pairs of a protrusion and a notch alternately, circumferentially arranged, and a plurality of pair of a hook and a hook notch alternately, circumferentially arranged, the protrusion fitting into the hooks, and wherein
   the notch allows the hook to move therethrough, the hook notch allowing the protrusion to move therethrough, the hook having a channel to allow the protrusions to move toward a fitted position.

4. The superconducting magnet as claimed in claim 1, wherein the main coil bobbin includes a main coil bobbin hook on a surface thereof facing the symmetrical plane, and the shield coil bobbin includes a shield coil bobbin hook on a surface thereof facing the symmetrical plane, the main coil bobbin hook fitting into the shield coil bobbin hook,
   wherein ends of the main coil bobbin hook and the shield coil bobbin hook are directed in opposite radial directions of each of the first and second torus coolant containers, and
   wherein the main coil bobbin hook and the shield coil bobbin hook have such sizes and locations that the shield coil hook allows the end of the main coil bobbin hook to vertically move beyond the shield coil bobbin hook at a shrink fitting process temperature and fits into the shield coil bobbin hook at the same temperature.

5. The superconducting magnet as claimed in claim 1, wherein at least one of the plate member, the main coil bobbin, the shield coil bobbin, and the main coil bobbin supporting member has a shape on a cross section in radial direction of the first and second torus coolant containers that varies in a circumferential direction of the first and second torus coolant containers.

6. The superconducting magnet as claimed in claim 1, further comprising a plurality of other main coil bobbin supporting members connected to the plate member and the main coil bobbin for supporting the main coil bobbin with respect to the plate member,
   wherein each of the first and second torus coolant containers has a structure including the plate member, the main coil bobbin, the shield coil bobbin, the main coil bobbin supporting member, and the plurality of other main coil bobbin supporting members for supporting the main coil bobbin with respect to the plate member, and wherein the main coil bobbin supporting member and the plurality of other main coil supporting members are discretely arranged in a circumferential direction of each of the first and second torus coolant containers, wherein the main coil supporting member and the plurality of other main coil supporting members comprise ribs.

7. The superconducting magnet as claimed in claim 1, wherein each of the first and second torus coolant containers has a structure including the plate member, the main coil bobbin, the shield coil bobbin, the main coil bobbin supporting member, and a plurality of other main coil bobbin supporting members for supporting the main coil bobbin with respect to the plate member, the structure has a stiffness, reinforced by the plate member, the main coil bobbin, the shield coil bobbin, the main coil bobbin supporting member, and the plurality of other main coil bobbin supporting members, that varies in a circumferential direction of each of the first and second torus coolant containers, wherein the main coil supporting member and the plurality of other main coil supporting members comprise ribs.

8. The superconducting magnet as claimed in claim 1, further comprising a magnetic member on a surface of the main coil bobbin opposite to a surface of the main coil bobbin facing the symmetrical plane.

9. A magnetic resonance imaging apparatus comprising a superconducting magnet comprising:
   first and second torus coolant containers substantially symmetrically, vertically arranged about a central axis to have a space and a symmetrical plane therebetween for storing a coolant, each of the first and second torus coolant containers including therein a main coil bobbin with a main coil for generating a measurement magnetic field, a shield coil bobbin with a shield coil for generating a shielding magnetic field for suppressing outside leakage of the measurement magnetic field, a plate member vertically reinforced at a plane thereof opposite to a plane thereof facing the symmetrical plane for supporting the shield coil bobbin and the main coil bobbin;
   a main coil bobbin supporting member connected to the plate member and the main coil bobbin for supporting the main coil bobbin with respect to the plate member; and
   a pillar comprising a vertical wall for supporting either of the first and second torus coolant containers in the vertical direction,
   wherein the main coil bobbin is further supported by the shield coil bobbin, to cause the main coil to generate the measurement magnetic field having a substantially uniform magnetic field intensity at a middle region of the space, the first and second torus coolant containers communicate with each other through the pillar, and the plate member is supported by the vertical wall, wherein the main coil bobbin of each of the first and second torus coolant containers is disposed at a first radial distance from the central axis and the shield coil bobbin of each of the first and second torus coolant containers is disposed at a second radial distance from the central axis, and wherein the second radial distance is greater than the first radial distance.

10. The superconducting magnet as claimed in claim 1, wherein the main coil bobbin is further supported by the shield coil bobbin to cause the main coil to generate the measurement magnetic field having a substantially uniform magnetic field intensity at a middle region of the space.

11. A superconducting magnet comprising:

first and second torus coolant containers for storing a coolant, the first and second torus coolant containers being symmetrically arranged in a vertical direction about a horizontal symmetry plane and are disposed around a central axis, each of the first and second torus coolant containers containing therein a main coil bobbin with a mail coil arranged about a vertical axis perpendicular to said horizontal symmetry plane and a shield coil bobbin with a shield coil, the main coils generating a measurement magnetic field having a substantially uniform intensity in a middle region of a space between said first and second torus coolant containers, the measurement magnetic field in said middle region of said space being along said vertical axis, the shield coils generating a shielding magnetic field for suppressing outside leakage of the measurement magnetic field, and the first and second torus coolant containers having respective walls facing the symmetry plane;

a pillar comprising a vertical wall for supporting either of the first and second torus coolant containers in the vertical direction;

wherein the horizontal walls are outer walls of said first and second torus coolant containers in the direction of said vertical axis and vertical wall, and wherein the first and second torus coolant containers each have a respective supporting member connected to the plate member and the main coil bobbin for supporting the main coil bobbin with respect to the plate member, the horizontal walls are plates having a thickness greater than the vertical walls, the horizontal wall of each torus coolant container supports the corresponding shield coil bobbin and supporting member and wherein the shield coil bobbin and supporting member of each torus coolant container supports the corresponding main coil bobbin, to thereby reduce distortion of the main coils, the first and second torus coolant containers communicate with each other through the pillar, and the plate member is supported by the vertical wall, wherein the main coil bobbin of each of the first and second torus coolant containers is disposed at a first radial distance from the central axis and the shield coil bobbin of each of the first and second torus coolant containers is disposed at a second radial distance from the central axis, and wherein the second radial distance is greater than the first radial distance.

12. The superconducting magnet as claimed in claim 1, further comprising a main coil bobbin supporting member for supporting the main coil bobbin with respect to the plate member, wherein the main coil bobbin is supported via the main coil bobbin supporting member and the shield coil bobbin.

13. The magnetic resonance imaging apparatus as claimed in claim 9, further comprising a main coil bobbin supporting member for supporting the main coil bobbin with respect to the plate member, wherein the main coil bobbin is supported via the main coil bobbin supporting member and the shield coil bobbin.

14. The superconducting magnet as claimed in claim 11, further comprising a main coil bobbin supporting member for supporting the main coil bobbin with respect to the plate member, wherein the main coil bobbin is supported via the main coil bobbin supporting member and the shield coil bobbin.

15. The superconducting magnet as claimed in claim 1, wherein the main coil supporting member is a rib fixed to the plate member, the shield coil bobbin, and the main coil bobbin.

16. The superconducting magnet as claimed in claim 15, wherein the rib has a shape on a cross section in a radial direction of the first and second torus coolant containers that varies in a circumferential direction of the first and second torus coolant containers.

17. The superconducting magnet as claimed in claim 9, wherein the main coil supporting member is a rib fixed to the plate member, the shield coil bobbin, and the main coil bobbin.

18. The superconducting magnet as claimed in claim 17, wherein the rib has a shape on a cross section in a radial direction of the first and second torus coolant containers that varies in a circumferential direction of the first and second torus coolant containers.

19. The superconducting magnet as claimed in claim 11, wherein each supporting member is a rib fixed to the plate member, the shield coil bobbin, and the main coil bobbin.

20. The superconducting magnet as claimed in claim 1, wherein the main coil supporting member is a rib having a rectangular shape and fixed to the plate member at a first side, the shield coil bobbin at a second side, and the main coil bobbin at a third side.

21. The superconducting magnet as claimed in claim 9, wherein the main coil bobbin supporting member is a rib having a rectangular shape and fixed to the plate member at a first side, the shield coil bobbin at a second side, and the main coil bobbin at a third side.

22. The superconducting magnet as claimed in claim 11, wherein each respective supporting member is a rib having a rectangular shape and fixed to the plate member at a first side, the shield coil bobbin at a second side, and the main coil bobbin at a third side.

* * * * *